(12) United States Patent
Huh et al.

(10) Patent No.: US 7,608,853 B2
(45) Date of Patent: Oct. 27, 2009

(54) SEMICONDUCTOR LIGHT EMITTING DIODE THAT USES SILICON NANO DOT AND METHOD OF MANUFACTURING THE SAME

(75) Inventors: Chul Huh, Daejeon (KR); Rae-Man Park, Daejeon (KR); Jae-Heon Shin, Daejeon (KR); Kyung-Hyun Kim, Daejeon (KR); Tae-Youb Kim, Seoul (KR); Kwan-Sik Cho, Daejeon (KR); Gun-Yong Sung, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 12/278,331

(22) PCT Filed: Jun. 27, 2008

(86) PCT No.: PCT/KR2006/002480

§ 371 (c)(1),
(2), (4) Date: Aug. 5, 2008

(87) PCT Pub. No.: WO2007/097500

PCT Pub. Date: Aug. 30, 2007

(65) Prior Publication Data

US 2009/0032836 A1    Feb. 5, 2009

(30) Foreign Application Priority Data

Feb. 21, 2006   (KR) ...................... 10-2006-0016665

(51) Int. Cl.
*H01L 29/06* (2006.01)
*H01L 31/0328* (2006.01)
*H01L 31/0336* (2006.01)
*H01L 31/072* (2006.01)
*H01L 31/109* (2006.01)
*H01L 29/22* (2006.01)
*H01L 33/00* (2006.01)
*H01L 21/00* (2006.01)
*H01L 21/26* (2006.01)
*H01L 21/324* (2006.01)
*H01L 21/42* (2006.01)
*H01L 21/477* (2006.01)

(52) U.S. Cl. ............................ 257/13; 257/12; 257/94; 257/E33.001; 977/773; 977/774; 438/46; 438/47; 438/795; 438/796; 438/962

(58) Field of Classification Search ............. 257/12–13, 257/94, E33.001; 977/773, 774; 738/46–47, 738/795–796, 962
See application file for complete search history.

(56) References Cited

U.S. PATENT DOCUMENTS 6,078,064 A    6/2000    Ming-Jiunn et al.

(Continued)

FOREIGN PATENT DOCUMENTS

JP    2000-164921    6/2000

(Continued)

OTHER PUBLICATIONS

Song et al., "Improvement of the luminous intensity of light-emitting diodes by using highly transparent Ag-indium tin oxide p-type ohmic contacts", IEEE Photonics Technology Letters, vol. 17, No. 2, Feb. 2005, pp. 291-293.

*Primary Examiner*—Ida M Soward
(74) *Attorney, Agent, or Firm*—Rabin & Berdo, PC

(57) ABSTRACT

Provided is a semiconductor light emitting diode that uses a silicon nano dot and a method of manufacturing the same. The semiconductor light emitting diode includes a light emitting layer that emits light; a hole injection layer formed on the light emitting layer; an electron injection layer formed on the light emitting layer to face the hole injection layer; a metal layer that includes a metal nano dot and is formed on the electron injection layer; and a transparent conductive electrode formed on the metal layer. Amorphous silicon nitride that includes the silicon nano dot is used as the light emitting layer.

13 Claims, 2 Drawing Sheets

U.S. PATENT DOCUMENTS

| | | | |
|---|---|---|---|
| 7,094,617 B2 * | 8/2006 | Shim et al. | 438/22 |
| 7,303,937 B2 * | 12/2007 | Chen et al. | 438/57 |
| 2005/0035346 A1 * | 2/2005 | Bazan et al. | 257/40 |
| 2005/0133809 A1 | 6/2005 | Song et al. | |
| 2005/0170643 A1 * | 8/2005 | Fujii et al. | 438/637 |
| 2005/0224778 A1 * | 10/2005 | Dubin et al. | 257/3 |
| 2006/0121745 A1 * | 6/2006 | Fujii | 438/790 |
| 2006/0222028 A1 * | 10/2006 | Hatori et al. | 372/45.01 |
| 2006/0238671 A1 * | 10/2006 | Kim et al. | 349/71 |
| 2006/0289853 A1 * | 12/2006 | Chen et al. | 257/14 |
| 2008/0093226 A1 * | 4/2008 | Briman et al. | 205/775 |

FOREIGN PATENT DOCUMENTS

| | | |
|---|---|---|
| KR | 2001-0095437 | 11/2001 |
| KR | 2004-0020582 | 3/2004 |
| KR | 2005-0063293 | 6/2005 |
| KR | 2006-0005244 | 1/2006 |

* cited by examiner

SEMICONDUCTOR LIGHT EMITTING DIODE THAT USES SILICON NANO DOT AND METHOD OF MANUFACTURING THE SAME

TECHNICAL FIELD

The present invention relates to a semiconductor light emitting diode that uses a silicon nano dot and a method of manufacturing the same.

BACKGROUND ART

A semiconductor light emitting diode that uses a silicon nano dot is operated by injecting carriers into a light emitting layer through an upper doping layer formed on an upper part of the light emitting layer and a current into the light emitting layer through the doping layer from an external electrode.

A conventional light emitting diode that uses a silicon nano dot is manufactured using a conductive electrode such as a thin metal film or an indium tin oxide (ITO) film on the upper doping layer. When the thin metal film is used on the upper doping layer, light emission efficiency is reduced since light emitted from the light emitting layer is absorbed by the thin metal film. Also, when an ITO film is used, the ITO film provides high transparency, but, since it is a thin oxide film, an interface contact between the ITO film and the upper doping layer is unsmooth. Therefore, the electrical characteristics of the semiconductor light emitting diode are reduced resulting in reduction of the light emission efficiency thereof.

DISCLOSURE OF INVENTION

Technical Problem

The present invention provides a semiconductor light emitting diode that uses a silicon nano dot to increase electrical characteristics and light emission efficiency of the semiconductor light emitting diode.

The present invention also provides a method of manufacturing a semiconductor light emitting diode that uses a silicon nano dot to increase electrical characteristics and light emission efficiency of the semiconductor light emitting diode.

Technical Solution

According to an aspect of the present invention, there is provided a semiconductor light emitting diode comprising: a light emitting layer that emits light; a hole injection layer formed on the light emitting layer; an electron injection layer formed on the light emitting layer to face the hole injection layer; a metal layer that comprises a metal nano dot and is formed on the electron injection layer, and a transparent conductive electrode formed on the metal layer.

The light emitting layer may comprise amorphous silicon nitride that comprises a silicon nano dot.

The electron injection layer may comprise an n-type SiC material such as n-type SiC or SiCN.

The metal layer may comprise one nano dot selected from the group consisting of Au, Ag, Mg, Al, Ni, Co, In, Cu, Pt, Ti, and an alloy of these metals.

The transparent conductive electrode may comprise one material selected from the group consisting of ITO, SnO2, In2O3, Cd2SnO4, and ZnO.

The method may further comprise forming upper and lower electrodes respectively on the transparent conductive electrode and the hole injection layer to apply a current to the semiconductor light emitting diode from the exterior.

According to another aspect of the present invention, there is provided a method of manufacturing a semiconductor light emitting diode, the method comprising: forming an electron injection layer on a light emitting layer that emits light; forming a metal layer on the electron injection layer; forming a transparent conductive electrode on the metal layer; and the metal layer is heat treated to comprise nano dot.

The method may further comprise forming a hole injection layer on the light emitting layer facing the electron injection layer.

The light emitting layer is an amorphous silicon nitride that comprises a silicon nano dot.

The electron injection layer may be deposited on the light emitting layer using an n-type SiC material.

The metal layer may be deposited on the electron injection layer using Au, Ag, Mg, Al, Ni, Co, In, Cu, Pt, Ti, and an alloy of these metals. The metal layer may be formed to have a thickness of 1000 nm or less, more preferably 1 to 2 nm.

A metal layer that includes a metal nano dot may be formed by heat treating the metal layer at a temperature in a range of room temperature to 1000° C. for 10 seconds to 1 hour. The metal nano dot can be readily formed under the above temperature and time conditions.

In this way, by forming an improved interface state between the transparent conductive electrode and the electron injection layer that includes an n-type silicon SiC material, the electrical characteristics and light emission efficiency of a semiconductor light emitting diode that uses a silicon nano dot can be increased.

ADVANTAGEOUS EFFECTS

A semiconductor light emitting diode according to the present invention can increase an interface contact between an electron injection layer and a transparent conductive electrode and can increase in electrical characteristics of the semiconductor light emitting diode by forming a metal layer that includes a metal nano dot between the electron injection layer and the transparent conductive electrode.

Also, in the semiconductor light emitting diode according to the present invention, the metal layer that includes a metal nano dot can be formed by heat treating at a temperature in a range of room temperature to 1000° C. after the metal layer is formed between the electron injection layer and the transparent conductive electrode. That is, an interface structure between the electron injection layer and the transparent conductive electrode can be controlled to increase an interface contact there between and to increase electrical characteristics of the semiconductor light emitting diode, thereby increasing light emission efficiency of the semiconductor light emitting diode that uses the silicon nano dot.

DESCRIPTION OF DRAWINGS

The above and other features and advantages of the present invention will become more apparent by describing in detail exemplary embodiments thereof with reference to the attached drawings in which.

BEST MODE

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

Figure 1:
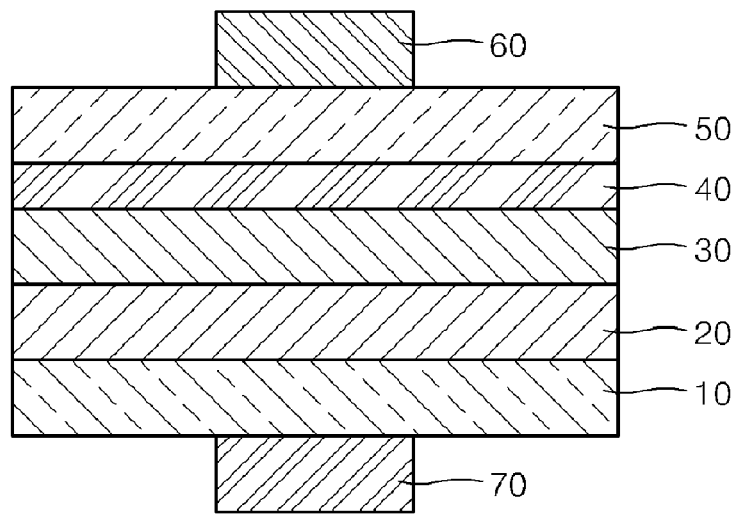
FIG. 1 is a cross-sectional view of a semiconductor light emitting diode according to an embodiment of the present invention.

FIG. 1 is a cross-sectional view of a semiconductor light emitting diode that uses a silicon nano dot according to an embodiment of the present invention.

Referring to FIG. 1, a light emitting layer 20 is formed on a hole injection layer 10. More specifically, the hole injection layer 10 can be a p-type Si substrate, and the light emitting layer 20 can be silicon nitride (SiN) that includes a silicon nano dot.

An electron injection layer 30 is formed on the light emitting layer 20, and can be an n-type Si carbide material, for example, SiC, SiCN, etc.

A metal layer 40 is formed on the electron injection layer 30. The metal layer 40 can be formed of Au, Ag, Mg, Al, Ni, Co, In, Cu, Pt, Ti, or an alloy of these metals, and preferably Ag. The metal layer 40 undergoes a heat treatment in a subsequent process and thus a metal nano is formed therein.

The metal layer 40 having the metal nano dot can have a thickness of 1000 nm or less. The metal layer 40 is for improving an interface contact between the electron injection layer 30 and a transparent conductive electrode 50, and may be formed to a thickness of 1 to 3 nm so that the metal nano dot can be easily formed.

The transparent conductive electrode 50 formed of ITO, SnO2, In2O3, Cd2SnO4, ZnO, etc., can be formed on the metal layer 40.

An upper electrode 60 and a lower electrode 70 can further be formed respectively on an upper surface of the transparent conductive electrode 50 and on a lower surface of the hole injection layer 10. The upper and lower electrodes 60 and 70 may be formed of a conductive material such as Ni, Au, etc. A current is injected into the transparent conductive electrode 50 and the hole injection layer 10 through the upper and lower electrodes 60 and 70, and accordingly a semiconductor light emitting diode that emits light can be realized by electrons and holes injected into the light emitting layer 30.

The metal layer 40 is formed by heat treating the metal layer 40 at a temperature in a range of from room temperature to 1000° C. for 1 second to 1 hour so that the metal nano dot is formed in the metal layer. The heat treatment can be performed before forming the transparent conductive electrode 50, or can be performed after the transparent conductive electrode 50 and the upper and lower electrodes 60 and 70 are formed.

The above layers can be deposited using a conventional deposition method such as a chemical vapour deposition, for example, plasma enhance chemical vapor deposition (PECVD) or physical vapor deposition.

Figure 2:
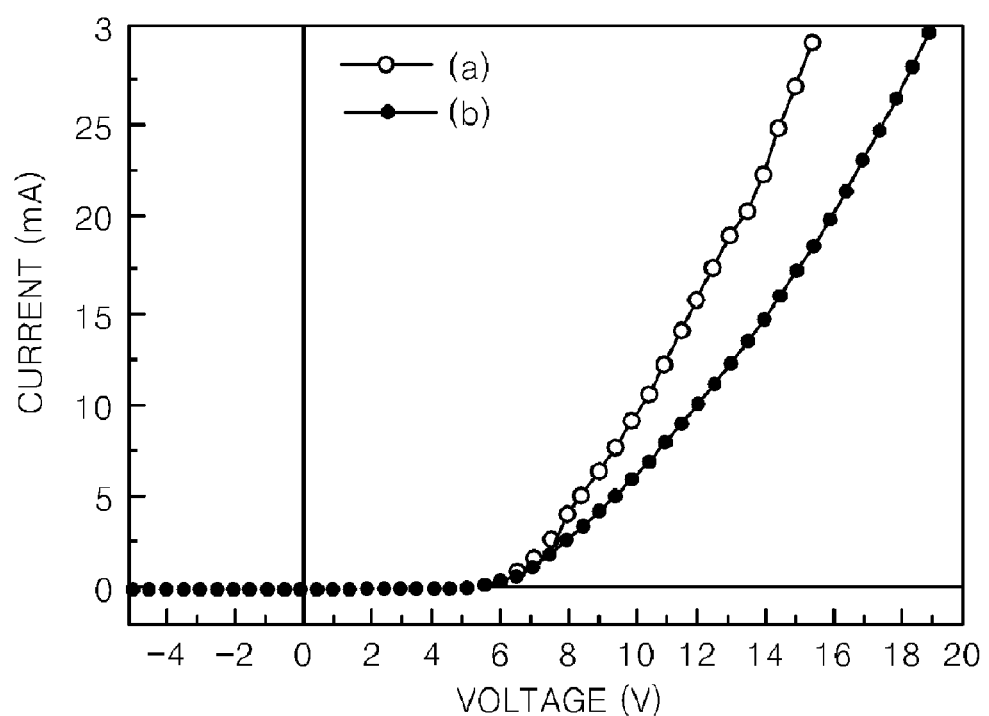
FIG. 2 is a graph showing electrical characteristics of a semiconductor light emitting diode according to an embodiment of the present invention.

FIG. 2 is a graph showing electrical characteristics of a semiconductor light emitting diode according to an embodiment of the present invention.

Figure 3:
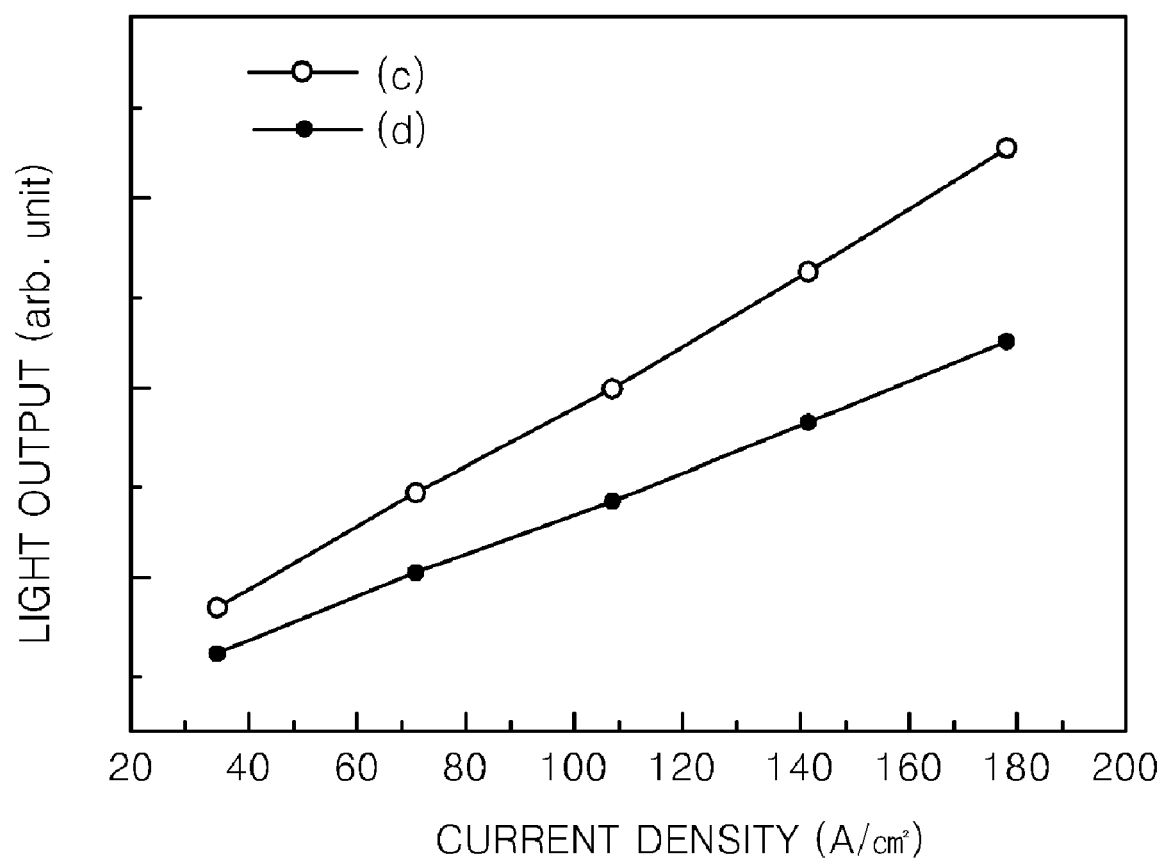
FIG. 3 is a graph showing optical characteristics of a semiconductor light emitting diode according to an embodiment of the present invention.

FIG. 3 is a graph showing optical characteristics of a semiconductor light emitting diode according to an embodiment of the present invention.

To test the electrical characteristics and optical characteristics of the semiconductor light emitting diode according to an embodiment of the present invention, the semiconductor light emitting diode that includes a metal nano dot was manufactured as follows.

A p-type Si substrate was used as the hole injection layer 10. An amorphous silicon nitride layer that includes a silicon nano dot was deposited on the p-type Si substrate using a PECVD method. At this time, argon-diluted 10% silane and NH3 gas were used as a growing gas during deposition. The amorphous silicon nitride layer that includes a silicon nano dot was grown to a thickness of 40 nm at a substrate temperature of 250° C. under a chamber pressure of 0.5 Torr using an RF plasma power of 5 W.

An n-type SiC layer having a thickness of 300 nm was grown on the amorphous silicon nitride layer that includes a silicon nano dot using a PECVD method. Argon-diluted 10% silane and methane were used as a growing gas, and try-methyl-phosphite (TMP) metalorganic was used as a doping gas source. The substrate temperature was 300° C., chamber pressure was 0.2 Torr, and RF plasma power was 40 W.

An Ag metal layer having a thickness of 2.5 nm was deposited on the n-type SiC layer using a thermal evaporation method.

An ITO film having a thickness of 100 nm was grown on the Ag metal layer using a pulsed laser deposition (PLD) method.

The resultant product was heat treated at a temperature of 500° C. for 30 minutes in a PLD chamber to cause the formation of an Ag nano dot between the n-type SiC layer and the ITO layer.

An upper electrode was deposited on an upper surface of the ITO film and a lower electrode was deposited on a lower surface of the p-type Si substrate using a thermal evaporation method. The upper electrode was formed of Au to a thickness of 150 nm, and the lower electrode was formed of Ni to a thickness of 30 nm, thereby completing the manufacture of the semiconductor light emitting diode according to an embodiment of the present invention.

As a comparative example, a semiconductor light emitting diode that does not have an Ag metal layer was manufactured using the same method of manufacturing the semiconductor light emitting diode according to an embodiment of the present invention except for forming the Ag metal layer. Currents that flow in the semiconductor light emitting diode according to an embodiment of the present invention and the semiconductor light emitting diode of the comparative example were measured by respectively applying a voltage to each of the semiconductor light emitting diodes.

Referring to FIG. 2, when a voltage of approximately 6V or more is applied, it is seen that a larger current flows in the semiconductor light emitting diode (a) according to an embodiment of the present invention than in the semiconductor light emitting diode (b) of the comparative example.

Accordingly, the semiconductor light emitting diode according to an embodiment of the present invention has superior electrical characteristics due to the improvement of the interface contact between the ITO film and the n-type SiC layer.

Also, optical outputs according to current densities, emitted through the each of the ITO films of the semiconductor light emitting diode according to an embodiment of the present invention and the semiconductor light emitting diode of the comparative example were measured using an optical power meter. Referring to FIG. 3, it is seen that the semiconductor light emitting diode (c) according to an embodiment of the present invention outputs larger amount of light than the semiconductor light emitting diode (d) of the comparative example. It is found that the semiconductor light emitting diode that includes a silicon nano dot according to an embodiment of the present invention has greatly increased optical characteristics since an interface contact between the ITO film and the n-type SiC layer is improved by inserting an Ag metal layer that includes an Ag nano dot between the ITO film and the n-type SiC layer.

As described above, a semiconductor light emitting diode according to the present invention can increase an interface contact between an electron injection layer and a transparent conductive electrode and can increase in electrical characteristics of the semiconductor light emitting diode by forming a metal layer that includes a metal nano dot between the electron injection layer and the transparent conductive electrode.

Also, in the semiconductor light emitting diode according to the present invention, the metal layer that includes a metal nano dot can be formed by heat treating at a temperature in a range of room temperature to 1000° C. after the metal layer is formed between the electron injection layer and the transparent conductive electrode. That is, an interface structure between the electron injection layer and the transparent conductive electrode can be controlled to increase an interface contact there between and to increase electrical characteristics of the semiconductor light emitting diode, thereby increasing light emission efficiency of the semiconductor light emitting diode that uses the silicon nano dot.

While this invention has been particularly shown and described with respect to the techniques for improving an interface contact between an electron injection layer and a transparent conductive layer to increase electrical characteristics of a semiconductor light emitting diode that uses a silicon nano dot according to the present invention and a method of manufacturing the semiconductor light emitting diode, but the present invention is not limited thereto. Therefore, it will be understood by those of ordinary skill in the art that various changes in form and details may be made therein without departing from the spirit and scope of the present invention as defined by the following claims.

The invention claimed is:

1. A semiconductor light emitting diode comprising:
   a light emitting layer that emits light;
   a hole injection layer formed on the light emitting layer;
   an electron injection layer formed on the light emitting layer to face the hole injection layer;
   a metal layer that comprises a metal nano dot, formed on the electron injection layer, and
   a transparent conductive electrode formed on the metal layer.

2. The semiconductor light emitting diode of claim 1, wherein the light emitting layer comprises amorphous silicon nitride that comprises a silicon nano dot.

3. The semiconductor light emitting diode of claim 1, wherein the electron injection layer comprises an n-type SiC material.

4. The semiconductor light emitting diode of claim 3, wherein the n-type SiC material is SiC or SiCN.

5. The semiconductor light emitting diode of claim 1, wherein the metal layer comprises at least one nano dot selected from the group consisting of Au, Ag, Mg, Al, Ni, Co, In, Cu, Pt, and Ti.

6. The semiconductor light emitting diode of claim 1, wherein the transparent conductive electrode comprises at least one material selected from the group consisting of ITO, $SnO_2$, $In_2O_3$, $Cd_2SnO_4$, and ZnO.

7. A method of manufacturing a semiconductor light emitting diode, the method comprising:
   forming an electron injection layer on a light emitting layer that emits light;
   forming a metal layer on the electron injection layer;
   forming a transparent conductive electrode on the metal layer; and
   heat treating the metal layer to comprise a metal nano dot in the metal layer.

8. The method of claim 7, further comprising forming a hole injection layer on the light emitting layer to face the electron injection layer.

9. The method of claim 7, wherein the light emitting layer is an amorphous silicon nitride that comprises a silicon nano dot.

10. The method of claim 7, wherein the electron injection layer is formed on the light emitting layer by depositing an n-type SiC material on the light emitting layer.

11. The method of claim 7, wherein the metal layer is formed on the electron injection layer by depositing a metal that comprises at least one metal selected from the group consisting of Au, Ag, Mg, Al, Ni, Co, In, Cu, Pt, and Ti.

12. The method of claim 7, wherein the heat treatment is performed at a temperature in a range of room temperature to 1000° C.

13. The method of claim 12, wherein the heat treatment is performed for 10 seconds to 1 hour.

* * * * *

UNITED STATES PATENT AND TRADEMARK OFFICE
CERTIFICATE OF CORRECTION

| | | |
|---|---|---|
| PATENT NO. | : 7,608,853 B2 | Page 1 of 1 |
| APPLICATION NO. | : 12/278331 | |
| DATED | : October 27, 2009 | |
| INVENTOR(S) | : Chul Huh et al. | |

It is certified that error appears in the above-identified patent and that said Letters Patent is hereby corrected as shown below:

Title page, item 22 (PCT Filed) "Jun. 27, 2008" should be "Jun. 27, 2006"

Signed and Sealed this

Twenty-sixth Day of January, 2010

David J. Kappos
*Director of the United States Patent and Trademark Office*